United States Patent
Welch et al.

(10) Patent No.: US 6,822,185 B2
(45) Date of Patent: Nov. 23, 2004

(54) TEMPERATURE CONTROLLED DOME-COIL SYSTEM FOR HIGH POWER INDUCTIVELY COUPLED PLASMA SYSTEMS

(75) Inventors: Michael Welch, Pleasanton, CA (US); Paul E. Luscher, Sunnyvale, CA (US); Siamak Salimian, Sunnyvale, CA (US); Rolf Guenther, Monte Sereno, CA (US); Zhong Qiang Hua, Saratoga, CA (US); Son Phi, Milpitas, CA (US); Peter Loewenhardt, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 10/267,711

(22) Filed: Oct. 8, 2002

(65) Prior Publication Data

US 2004/0065645 A1 Apr. 8, 2004

(51) Int. Cl.$^7$ ................................................ B23K 9/00
(52) U.S. Cl. ................... 219/121.43; 219/399; 392/414
(58) Field of Search ........................ 219/121.43, 121.44, 219/121.48, 399, 400, 530, 531, 540; 156/345, 643.1, 646.1; 118/723 I, 723 R, 723 MW, 715; 204/298.37, 298.38, 298.21; 392/407, 411, 414, 416

(56) References Cited

U.S. PATENT DOCUMENTS

| | | | |
|---|---|---|---|
| 5,540,800 A | | 7/1996 | Qian |
| 5,894,887 A | | 4/1999 | Kelsey et al. |
| 6,146,508 A | * | 11/2000 | Gopalraja et al. ...... 204/298.06 |
| 6,308,654 B1 | | 10/2001 | Schneider et al. |
| 6,339,206 B1 | * | 1/2002 | Johnson ................. 219/121.43 |
| 6,627,856 B2 | * | 9/2003 | Korwin et al. .............. 219/400 |

* cited by examiner

Primary Examiner—Tu Ba Hoang
(74) Attorney, Agent, or Firm—Townsend & Townsend & Crew

(57) ABSTRACT

The temperature of a plasma chamber of a semiconductor fabrication tool is maintained substantially constant utilizing a variety of techniques, separately or in combination. One technique is to provide the exterior surface of the plasma chamber dome with a plurality of fins projecting into high velocity regions of an overlying airflow in order to dissipate heat from the chamber. Ducting defined by cover overlying the exposed exterior surface of the dome may also feature projecting lips or an airfoil to place high velocity components of the airflow into contact within the exterior dome surface and the fins. Other techniques include employing a high speed fan to control airflow circulation, and the use of temperature sensors in communication the fan through a processor to control fan speed and thereby regulate chamber temperature.

56 Claims, 10 Drawing Sheets

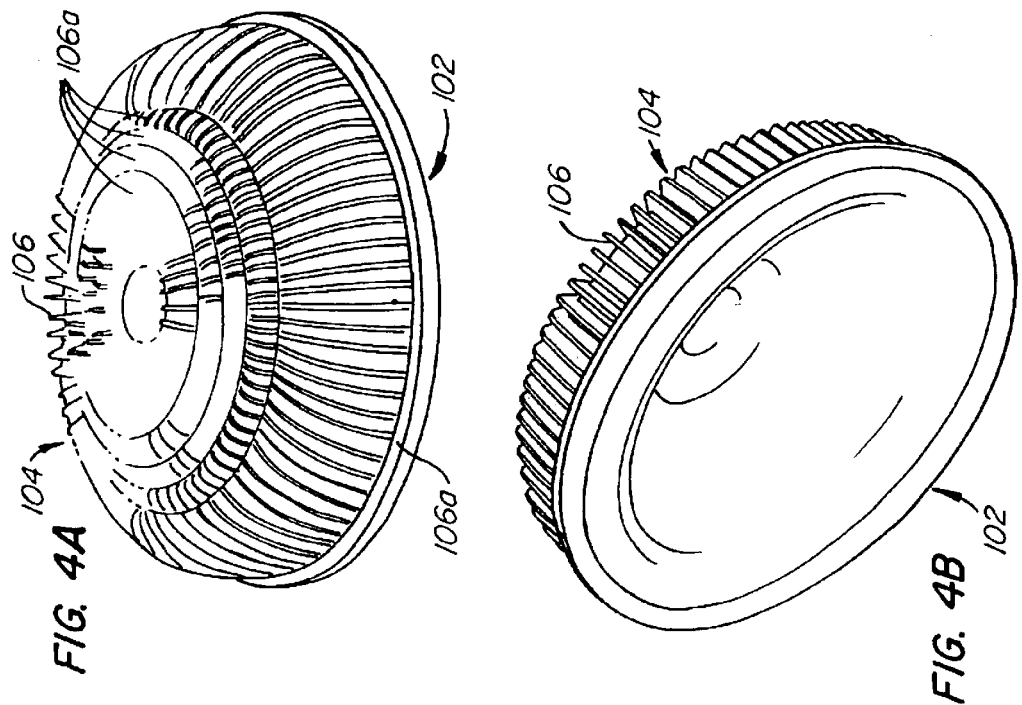
FIG. 3
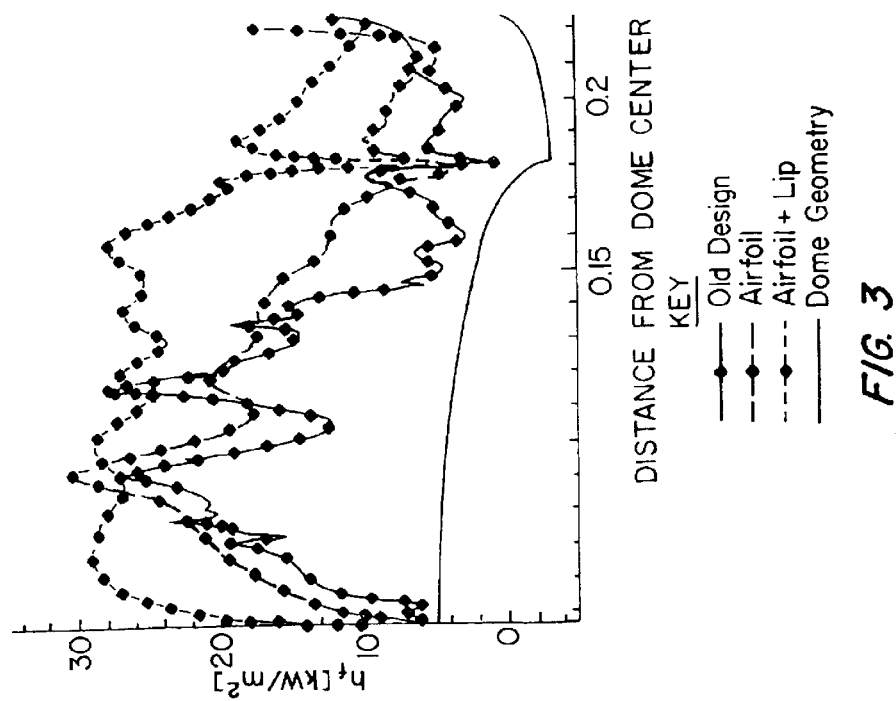
FIG. 4A
FIG. 4B

TEMPERATURE CONTROLLED DOME-COIL SYSTEM FOR HIGH POWER INDUCTIVELY COUPLED PLASMA SYSTEMS

BACKGROUND OF THE INVENTION

Several methods for fabricating semiconductor devices utilize a plasma generated or maintained within a processing chamber. The character of the plasma within the chamber has an important effect upon the results of the fabrication process, such as etching or chemical vapor deposition.

For example, the quality of the plasma generated may be characterized by high density ion generation and ion energy control. One kind of plasma reactor of interest is the inductively coupled plasma reactor. The plasma in such a reactor is generated inside a vacuum chamber by a coiled RF antenna, typically located on the ceiling dome and/or sides of the plasma chamber.

By adjusting the RF current in the antenna, the density of the ions can be controlled. The energy of the ions can be controlled by another RF power, usually called RF bias, that is connected to the wafer pedestal. However, ion energy is not mono-energetic, and ion energy distribution is dependent on many factors, including but not limited to bias power and frequency, ion species, and plasma density.

One factor affecting the quality of the process on the wafer is fluctuation in dome temperature. Fluctuation in dome temperature may generate particles that deposit on the wafer and may result in nonuniformity and lack of repeatability of a deposited film of material. In addition, variation in temperature over regions of the dome may result in excessive mechanical stress that can ultimately result in dome fracture.

Another issue faced by the designers of plasma generation chambers is capacitive coupling between the RF antenna and the ions of the plasma. Increased capacitive coupling between the antenna and the plasma can give rise to an elevated plasma potential in the proximity of the dome surface, thereby increasing the energy of the ions impinging on the dome surface. High ion energies give rise to excessive ion bombardment on the dome wall adjacent to the RF antenna, thereby increasing the number of contaminant particles and the rate of wear of the chamber.

A number of techniques can be employed alone or in conjunction to reduce capacitive coupling. In one approach, a Faraday shield can be placed between the RF antenna and the generated plasma. The Faraday shield is a grounded conductive layer that includes narrow, elongated openings having a major axis perpendicular to the windings of the RF coil antenna. These openings act to suppress any eddy currents that would otherwise tend to be induced in the Faraday shield. The conductive, fixed potential plane of the Faraday shield prevents capacitive coupling from voltage oscillations in the coil to the plasma. The suppression of eddy currents allows the inductive coupling of the electromagnetic field to couple to the plasma.

Given the importance of plasma-based processes to the fabrication of semiconductor devices, methods and structures permitting enhanced durability and reliability of plasma-based fabrication apparatuses are desirable.

SUMMARY OF THE INVENTION

The temperature of a plasma chamber of a semiconductor fabrication tool and hence the character of the plasma generated therein, may be maintained substantially constant utilizing a variety of techniques alone or in combination. One technique is to provide an exterior surface of a dome overlying the plasma chamber with a plurality of projecting fins effective to conduct heat from the chamber into an overlying circulating airflow defined between the dome and a dome cover. The dome cover may further define projecting lips or an airfoil structure that place the circulating airflow into intimate contact within the dome surface. Other techniques include employing an independently-controlled high speed fan to drive the airflow circulation, and the use of sensors in the dome to precisely monitor temperature.

An embodiment of a substrate processing chamber in accordance with the present invention comprises a housing having a processing region and a substrate support to support a substrate for processing in the processing region. The housing includes a chamber top which has an external surface, wherein a plurality of heat conducting fins project from the external surface of the chamber top.

An embodiment of a substrate processing apparatus in accordance with the present invention comprises a processing chamber including a side and a top, and a top RF source configured to apply top RF energy to the processing chamber through the top. A side RF source is configured to apply side RF energy to the processing chamber through the side, and a plurality of heating members are configured to apply thermal energy to different regions of the processing chamber, the plurality of heating members having thermal outputs which are regulated to provide a generally uniform temperature in the processing chamber.

An alternative embodiment of a substrate processing apparatus in accordance with the present invention comprises a processing chamber including a side and a top, and a cover spaced above the top to define a fluid pathway between an inner surface of the cover and an external surface of the top, the fluid pathway extending radially from an inlet located near a center of the top to and outlet located around a periphery of the top to permit a fluid flow therethrough. At least one flow diverter is disposed in the fluid pathway to divert the fluid flow against the external surface of the top.

An embodiment of a dome structure in accordance with the present invention for a semiconductor processing tool comprises a ceramic member configured to form a portion of a housing defining a chamber of the semiconductor processing tool. A fin is configured to project from an external surface of the ceramic member.

An embodiment of a method for maintaining substantially constant a temperature of a plasma processing chamber subjected to an applied RF power to generate a plasma therein, comprises providing a fin on an exterior surface of the chamber. A flow of a cooling fluid is caused to contact the fin and convey thermal energy away from the chamber.

These and other embodiments of the present invention, as well as its features and some potential advantages are described in more detail in conjunction with the text below and attached figures.

BRIEF DESCRIPTION OF THE DRAWINGS

FIG. 3 plots heat transfer coefficient versus distance from the dome center along the surface of the dome for some of the designs shown in FIGS. 2A–2D.

FIGS. 4A and 4B show top and underside perspective views, respectively of an embodiment of a finned dome in accordance with the present invention.

DESCRIPTION OF THE SPECIFIC EMBODIMENTS

The temperature of a plasma chamber of a semiconductor fabrication tool and hence the chamber of the plasma converted therein, is maintained substantially constant utilizing a variety of techniques alone or in combination. One technique is to provide an exterior surface of the plasma chamber with a plurality of projecting fins effective to dissipate heat into the surrounding environment, for example a circulating airflow. Ducting proximate to the exterior surface of the chamber may include projecting lips or an airfoil to place a circulating airflow into intimate contact with the exterior surface of the chamber and the fins. Other techniques include employing an independently-controlled fan for circulation of the air flow, and the use of sensors in the chamber walls and ceiling in order to precisely monitor temperature.

Figure 1A:
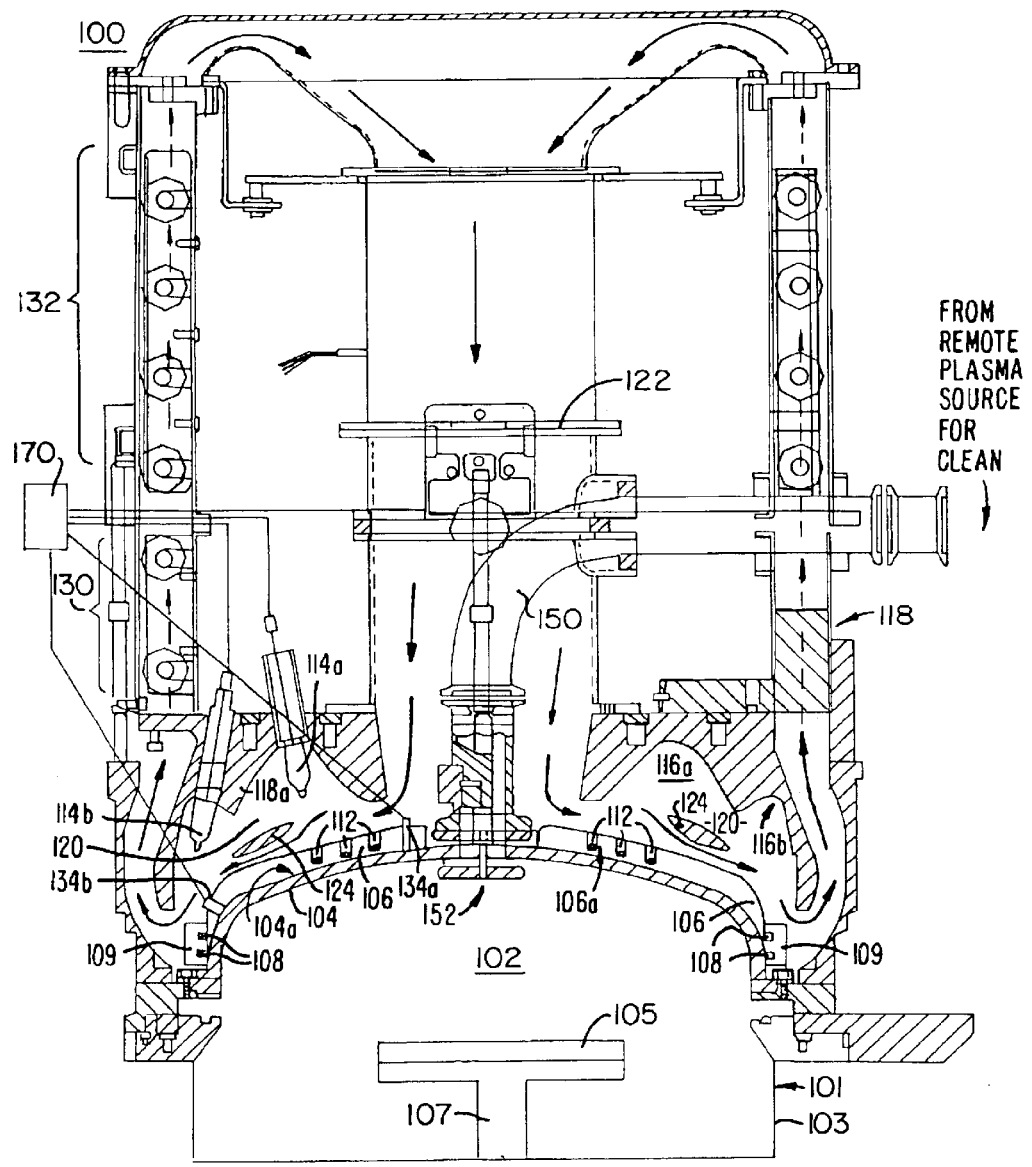
FIG. 1A shows a simplified cross-sectional view of one embodiment of an air-cooled temperature controlled dome-coil structure in accordance with the present invention.

FIG. 1A shows a simplified cross-sectional view of one embodiment of a temperature controlled dome-coil structure in accordance with the present invention. High density plasma chemical vapor deposition (HDP-CVD) apparatus 100 comprises housing 101 defining plasma chamber 102. Housing 101 comprises walls 103 and ceiling or top 104 that enclose substrate support 107 and substrate 105 supported thereon. Ceiling 104 comprises a non-electrically conducting ceramic member functioning as a window to allow RF energy to enter the chamber from surrounding coils 108 and 112, as is described in detail below. A separate bias RF power may be applied to the substrate through the substrate support.

In the specific embodiment illustrated in FIG. 1A, the ceramic member comprises a rounded dome defining the ceiling of the processing chamber. However, this is not required and alternative embodiments of the present invention could define a wall or a portion of a wall of the chamber. Moreover, while the specific embodiment shown in FIG. 1A illustrates the ceramic member as having the shape of a rounded dome, this is also not required and alternative embodiments of the present invention could utilize a ceramic member having a planar or non-rounded shape. For the purposes of this application, the term "dome" can refer to any portion of the housing of a processing chamber proximate to an RF source applying radiation to generate a plasma within a processing chamber.

Cover 118 overlies dome 104, and the inner surface of the cover defines a circulating pathway 120 for cooling fluid over the exterior dome surface 104a. Dome 104 bears radially-oriented fins 106 that project into circulating air pathway 120. As discussed in detail below, fins 106 serve to efficiently conduct heat away from dome 104 into the cooling fluid flowing through pathway 120. While the cooling fluid flowing through the pathway typically comprises air, other fluids having desirable thermal characteristics could alternatively be employed.

The cooling fluid is circulated through pathway 120 by fan 122. The circulating air is pushed downward onto the center of exposed exterior surface 104a of dome 104, and then flows outward from the dome center into contact with peripheral regions of the dome. Circulating air heated by contact with the dome is conveyed upward through first heat exchanger 130 and second heat exchanger 132 for cooling, and is then fed back to fan 122. An air circulation pathway in the form of a closed loop is not required by the present invention, and alternative embodiments could utilize a continuous flow of air inlet from the exterior environment that is circulated and then exhausted.

The heat exchanger may be designed to remove heat from the air flow by transferring the thermal energy to a heat removal system with a maximum temperature drop and a minimum head loss. The multiple successive stages 130 and 132 of the heat exchangers illustrated by the specific embodiment of FIG. 1A remove thermal energy at progressively lower temperatures in order to maximize efficiency of the heat exchanger. This approach is particularly useful in situations where lower temperatures of incoming air are required. A distinct heat exchanger structure is not required by the present invention, however, and alternative embodiments may simply rely upon ambient air cooling The shape of dome cover 118 defines certain air flow diverting features which enhance contact between the dome and high velocity components of the circulating air flow. For example, air flowing from fan 122 to the dome center encounters internal lip 160 of the lamp base, which forces the circulating air against the center dome surface.

The circulating air next encounters airfoil 124, which is aerodynamically shaped to direct the air flow in pathway 120 against exterior dome surface 104a, thereby preventing flow separation as the airflow is required to follow the curvature of the dome. Airfoil 124 may be suspended within the air flow pathway utilizing braces or struts (not shown), or may be integral with one side of the cover. In certain embodiments of the present invention, the airfoil member is spaced from the external surface of the chamber top by a distance smaller than a distance between the dome cover and the external surface of the top at the air flow inlet, or a distance between the cover and the external surface of the top at the air flow outlet.

Prior to exiting the vicinity of the dome, the circulating air flows past external lip 162 of the lamp base, such that high velocity components of the air flow are forced into contact with the dome periphery.

Heating lamps 114a and 114b are housed within inner and outer lamp zones 116a and 116b proximate to central and peripheral regions of the dome, respectively. Separate temperature sensors 134a and 134b are positioned adjacent to the central and peripheral dome regions, respectively. These separate temperature sensors serve to enhance the precision of the temperature profile detected from the dome, and the structure and function of these embodiments of temperature sensors are described in detail below in conjunction with FIGS. 8A and 8B.

Fan 122, heating lamps 114a and 114b, and temperature sensors 134a and 134b are each in independent electronic communication with processor 170. As discussed in detail below, based upon electronic signals received from sensors 134a and 134b, processor 170 is configured to control the power fed to fan 122 and lamps 114a and 114b according to a specific algorithm to maintain the dome temperature within a particular temperature range.

Dome cover 118 further includes top remote clean feed 150 receiving plasma from a remote source for cleaning purposes. Apparatus 100 further comprises top centerfeed gas nozzle 152 for providing process gases to chamber 102.

Two sets of RF coils are provided adjacent to plasma chamber 102 to control the energy and density of the plasma generated therein. Side coils 108 are supported by ceramic spacers 109 and wrap around the sides of dome 104. Top coils 112 are positioned over upper exposed surface 104a of dome 104 within notches 106a of fins 106.

Figure 1B:
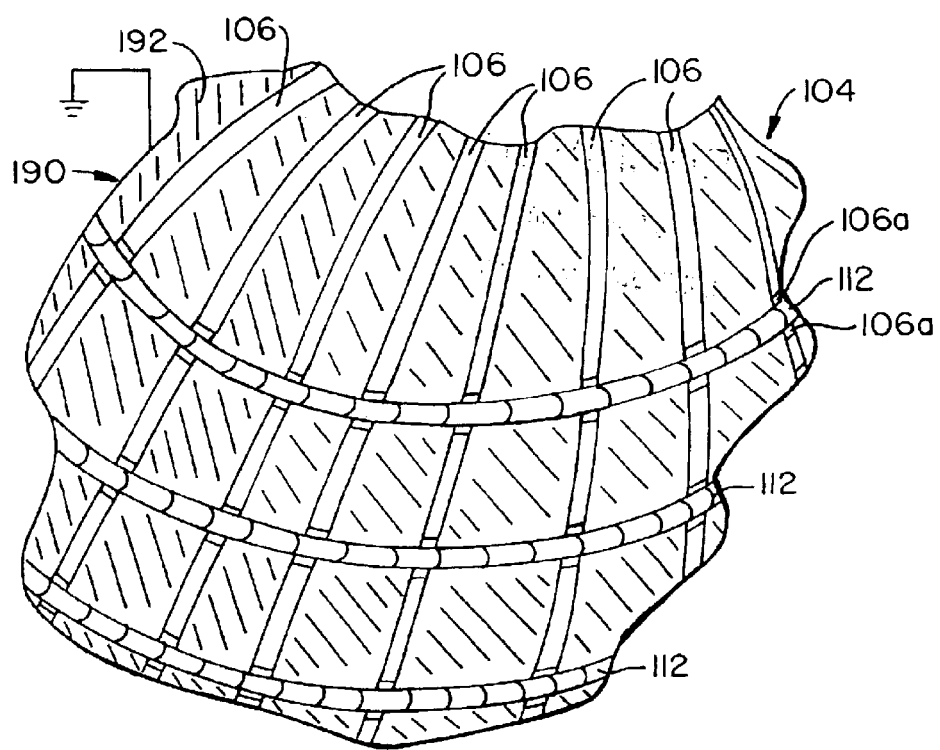
FIG. 1B shows an enlarged perspective view of a portion of the dome of FIG. 1A.

FIG. 1B shows an enlarged perspective view of a portion of dome 104. FIG. 1B shows that inter-fin regions 190 of dome 104 bear a grounded, electrically conductive material 192. Fins 106 thus serve to define corresponding elongated gaps in conductive material 192. As discussed at length below, the orientation of fins 106 perpendicular to the direction of top coils 112 creates a Faraday shield from the electrically conductive material 192, thereby reducing unwanted capacitive coupling between the coil and the plasma.

1. Internal Ducting

Embodiments of apparatuses in accordance with the present invention include a number of features that enhance the uniformity and consistency of plasma generated therein. For example, one feature of the embodiment of the plasma apparatus shown in FIG. 1A is the configuration of the internal ducting that conveys the circulating airflow between the lamp base and the exposed exterior surface of the dome.

Internal ducting directs the airflow to achieve maximum air velocity at and across the entire exterior surface of the dome in order to maximize the heat transfer coefficient. The orientation of internal ducting positions circulating airflow in regions of the highest power deposition. The high head generated by the fan enables the air velocity to be maximized. The shape of the internal ducting is also designed to keep unnecessary head losses to a minimum.

Figure 2A:
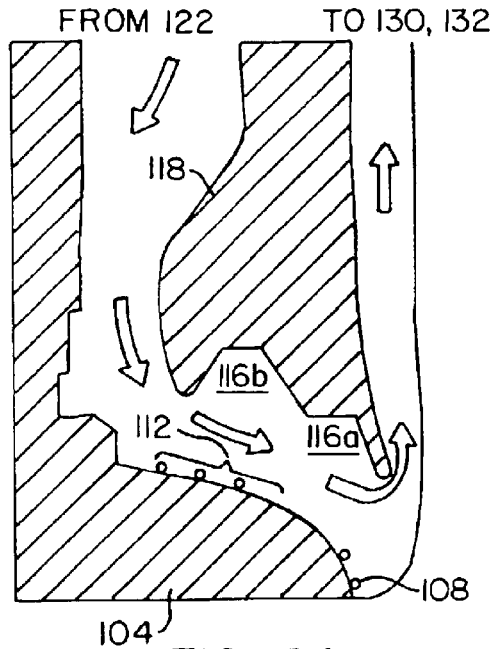
FIGS. 2A–2D show airflow velocity across the dome calculated for different dome/lamp base cavity designs.
Figure 2B:
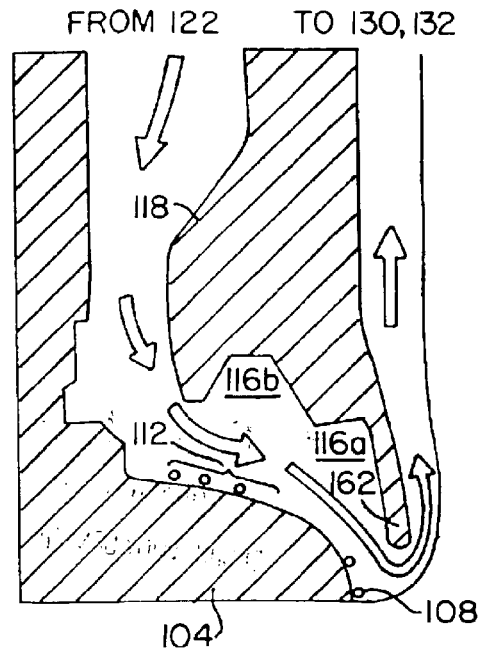
Figure 2C:
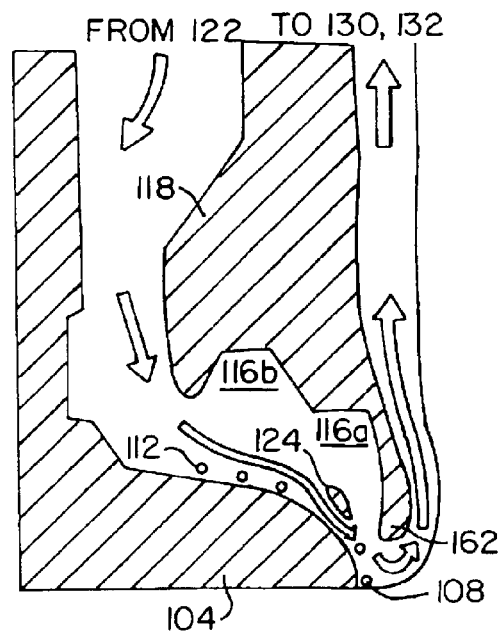
Figure 2D:
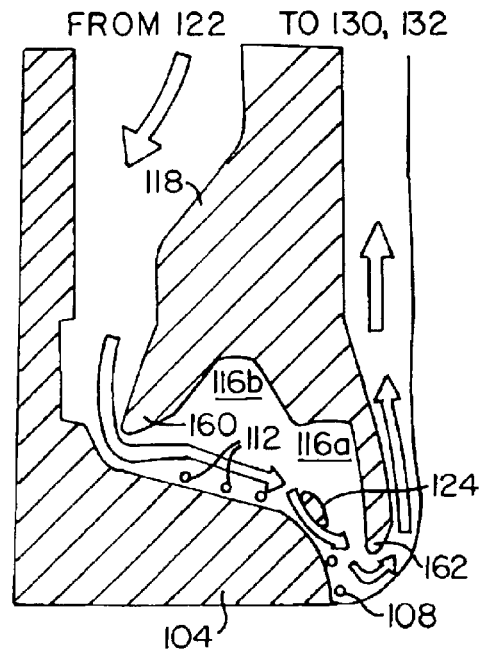

FIGS. 2A–2D show airflow path calculated across the upper exposed surface of the dome for several designs of ducting configurations. FIG. 2A shows the airflow path for a conventional dome 104. FIG. 2B shows the airflow path for dome 104 in the presence of a ducting configuration including an extended external lip 162. FIG. 2C shows the airflow velocity for dome 104 in the presence of a ducting configuration including an elongated external lip 162 and an airfoil 124. FIG. 2D shows the airflow velocity for dome 104 in the presence of a ducting configuration including an elongated external lip 162, an airfoil 124, and an elongated internal lip 160.

FIGS. 2A–2D illustrate the importance of the design of the internal ducting in efficient utilization of the air stream in the region above the dome. Specifically, FIGS. 2A–2D show that the presence of an airfoil and/or projecting lips enhances contact of the cooling airflow with the dome surface.

FIG. 3 plots heat transfer coefficient ($h_f$) versus distance from the dome center along the surface of the dome for several of the dome/lamp cavity designs illustrated in FIGS. 2A–2D. FIG. 3 illustrates the dependence of the heat transfer from the dome on airflow optimization which increases air flow velocity at the dome surface. Specifically, the embodiment of FIG. 2D, combining an airfoil with both an internal and an external projecting lip, exhibits the most consistently high heat transfer coefficient across the entire surface of the dome.

2. Finned Dome

In the embodiment of a plasma apparatus depicted in FIGS. 1A–B, fin structures 106 are provided over the exterior surface of the dome in a radial orientation. FIGS. 4A and 4B show top and underside perspective views of finned domes 104 designed for a 300 mm HDP chamber. Fins 106 may serve a number of purposes.

One function of the fins is to enhance the transfer of heat away from the dome, as may be desirable when the dome is to be cooled in order to maintain a substantially constant temperature. The fins may increase the surface area of the exterior dome surface, enhancing the quantity of heat transferred from the dome to the overlying circulating airflow. The fins may also project upward into higher velocity regions of the overlying airflow, thereby enhancing the quality of contact between the dome and the airflow and allowing more heat to be transferred away from the dome. The presence of the fins may also create turbulence in the overlying airflow, thereby disrupting static airflow boundary layer conditions and enhancing thermal interaction between the dome and the airflow.

Another function of the fins may be to physically support the coil structure proximate to the dome. For example, fins 106 shown in FIGS. 1A–B and 4A–B include concentric notches 106a for receiving and positioning the top coil of the apparatus. The fins further provide physical support to the top and side RF coils, and stiffen the dome by allowing thinning of gaps between the fins. The provision of fins as coil support structures also avoids overheating of conventional support structures that can disrupt airflow over the dome surface.

Yet another function of the fins may be to enhance transfer of heat to the dome, as may be desirable when the dome is to be heated in order to maintain a substantially constant temperature. Specifically, the fins may increase the surface area of the dome available to receive energy radiated from the adjacent lamps. Moreover, the presence of the fins may eliminate the need for separate coil support structures that would otherwise interfere with effective transmission of radiation to the dome.

In accordance with alternative embodiments of the present invention, emissivity of the dome may be enhanced in other ways to enhance absorption of radiation from a heat source. Emissivity of the exterior surface of the dome may be further optimized, for example, by roughening or by coating with a material that absorbs optical radiation in the spectral region where power emanating from the radiant heat sources is concentrated.

Still another function of the fins may be reduce unwanted capacitive coupling. Specifically, as shown in FIG. 1B the position and orientation of the fins on the dome may define inter-fin regions bearing a grounded, electrically conductive material. Where the fins are oriented perpendicular to the direction of the coil, the pattern of conductive inter-fin regions separated by elongated gaps corresponding to the location of the fins, may function as a Faraday shield. Embodiments in accordance with the present invention further incorporating a Faraday shield structure are described in detail below.

The fins can be formed in several ways. Integral fin structures can be formed during the dome casting process. Alternatively, the fins can be glazed onto the dome. In this latter approach, the dome and fins should be formed from materials having matching coefficients of expansion, avoiding physical stress on the dome attributable to any mismatch.

Further alternatively, the fins can be attached to the dome using an intermediate, heat transfer medium exhibiting mechanical compliance characteristics that allow for repeated, thermally-induced expansion and contraction of the dome and fin material. This alternative approach is particularly suited for structures where the dome and fins are formed from materials having different coefficients of thermal expansion.

The number and pattern of fins on the dome may be optimized to maximize heat transfer. For example, as dome radius is increased, additional radial fins can be added. Moreover, while the fins shown in FIGS. 4A and 4B are radial in orientation, but this is not required. Fins can also be slotted or angled to affect the turbulence and velocity of the airflow circulating over the surface of the dome.

Figure 5:
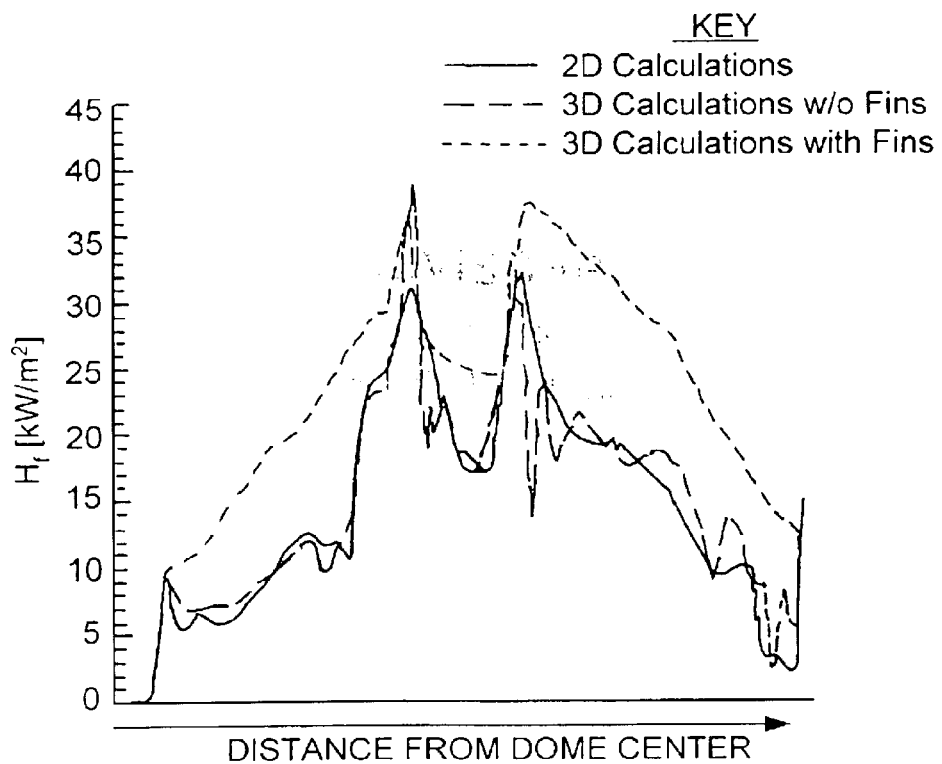
FIG. 5 plots modeled heat transfer coefficient versus distance from the dome center for smooth and finned domes.

FIG. 5 plots modeled heat transfer coefficient ($h_f$) versus distance from the dome center for smooth and finned domes. Comparison of the modeled heat removal between a finned and a non-finned dome shows the improved ability of the fins to remove heat from the dome.

3. Multiple Heating Zones

Another advantage offered by embodiments in accordance with the present invention is the provision of multiple zones for applying heat to the chamber dome.

As described above, plasma generation apparatuses in accordance with embodiments of the present invention may include multiple structures for generating/maintaining a plasma within a chamber. In the particular embodiment shown in FIG. 1A, separate RF coil structures 108 and 112 are positioned adjacent to the sides and top of the plasma chamber. The relative power applied to the coils, and hence the temperature of portions of the dome proximate to these coils, may differ substantially.

Accordingly, embodiments in accordance with the present invention may include multiple heating zones designed to selectively deliver thermal energy to different regions of the dome, thereby ensuring uniformity of temperature. In the embodiment shown in FIG. 1A, multiple heating zones are created by the position of the lamps within the inner and outer lamp zones. However, the present invention is not limited to this particular embodiment, and multiple heating zones could be created in other ways, for example by the placement of resistive heating/Faraday shield structures proximate to regions of the dome in communication with different RF power sources.

The ratio of powers provided to the multiple heating zones can be established by the process recipe to compensate for the different power generated by side and top coils, and by the wafer bias RF sources. For example, the power from the inner and outer lamp zones of FIG. 1A can be independently controlled from the top and side temperature sensor readings through independent proportional/integral/differential (PID) controllers. Settings of the inner and outer lamp powers can be set by the process recipe through relatively simple algorithms designed to compensate for the different powers generated by the side coil, top coil, and bias RF sources, as well as for different chemistry effects:

$$W_{Inner\ Lamp\ Ring} = a(W_{side\ max} - W_{side}) + b(W_{top\ max} - W_{top}) + c(W_{bias\ max} - W_{bias});\ \text{where:} \quad (1)$$

$W_{Inner\ Lamp\ Ring}$=power supplied to inner lamp ring;
a=first coefficient;
$W_{side\ max}$=maximum power supplied to side coil;
$W_{side}$=power supplied to side coil;
b=second coefficient;
$W_{top\ max}$=maximum power supplied to top coil;
$W_{top}$=power supplied to top coil;
c=third coefficient;
$W_{bias\ max}$=maximum power supplied to bias wafer; and
$W_{bias}$=power supplied to bias wafer.

$$W_{Outer\ Lamp\ Ring} = a'(W_{side\ max} - W_{side}) + b'(W_{top\ max} - W_{top}) + c'(W_{bias\ max} - W_{bias});\ \text{where:} \quad (2)$$

$W_{Outer\ Lamp\ Ring}$=power supplied to outer lamp ring;
a'=first coefficient;
$W_{side\ max}$=maximum power supplied to side coil;
$W_{side}$=power supplied to side coil;
b'=second coefficient;
$W_{top\ max}$=maximum power supplied to top coil;
$W_{top}$=power supplied to top coil;
c'=third coefficient;
$W_{bias\ max}$=maximum power supplied to bias wafer; and
$W_{bias}$=power supplied to bias wafer.

The algorithms shown in Equations (1) and (2) above are merely examples. Other algorithms could be devised to govern plasma-based process parameters and control temperature in accordance with embodiments of the present invention.

4. Circulating Fan

Yet another feature of the embodiment of the plasma apparatus shown in FIG. 1A is provision of a fan to create a high velocity airflow circulating within the cooling pathway. Such a fan delivers a cooling airflow at velocities sufficient to carry away heat transferred to the dome from plasma excited by inductive RF current of the dome coils and the RF water bias voltage. This cooling airflow allows the apparatus to operate with little temperature rise.

High velocity, high head fans which may be employed in accordance with embodiments of the present invention are manufactured by Breeza Fans USA of Utica, Nebr., and by Ametek Rotron Technical Products of Kent, Ohio. One example of a suitable fan was a variable frequency fan manufactured by Ametek Rotron, running at 150–400 Hz. The pressure head varied between 4–8" of $H_2O$ at about 300 CFM. At 400 Hz the pressure head was 6" of $H_2O$ and the CFM was 400.

The speed of the fan ($S_{Fan}$) and hence the velocity of the airflow, may be continuously and rapidly varied and can be controlled through a PID loop associated with the temperature sensors, alone or in combination with the powers of the multiple heating zones. The fan speed may be set by the process recipe according to the following sample algorithm:

$$S_{Fan} = a''(W_{side}) + b''(W_{top}) + c''(W_{bias});\ \text{where:} \quad (3)$$

$S_{Fan}$=fan speed;
a''=first coefficient;
$W_{side}$=power supplied to side coil;

b"=second coefficient;
$W_{top}$=power supplied to top coil;
c"=third coefficient; and
$W_{bias}$=power supplied to bias wafer.

The algorithm shown in Equation (3) above is merely an example. Other algorithms could be devised to control process parameters in order to control temperature in accordance with embodiments of the present invention.

Independent control over the speed of the fan allows it to be synchronized with operation of the external heat sources such as heat lamps or resistive heaters, thereby reducing forced convective cooling during external heating. This maximizes power efficiency and heating and cooling response. Exercise of independent control over fan speed allows the circulating airflow to be synchronized with a dome temperature controller. This allows the fan to function independently or in conjunction with the lamps or resistive heaters to achieve temporal control over dome temperature.

Figure 6:
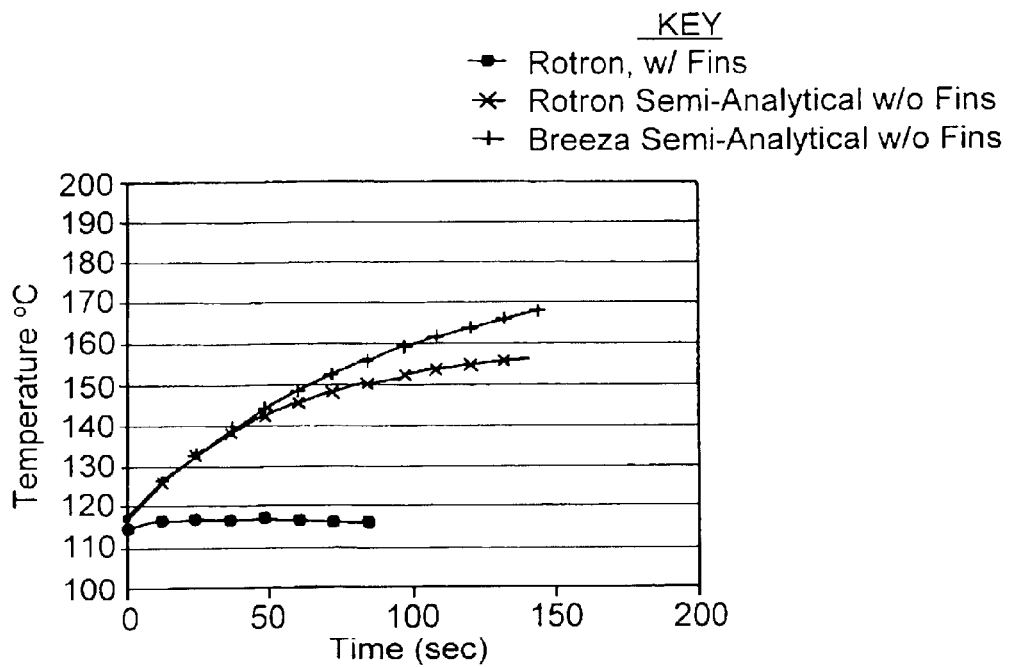
FIG. 6 plots dome temperature versus time from plasma strike for plasma chamber architectures featuring various combinations of fan and fin configurations.

FIG. 6 plots dome temperature versus time from plasma striking for plasma dome configurations featuring various combinations of fan and fin configurations. Specifically, FIG. 6 shows the measured effect of improved airflow and fins on heat removal from a dome under 10 KW of total power, with the top coil at 4400 W, the side coil at 2100 W, and the wafer bias at 3500 W. FIG. 6 shows that for a conventional plasma device utilizing a first fan type and a chamber dome lacking fins, the temperature of the chamber appeared to stabilize after at least 200 sec. to a final temperature ($T_f$) of about 180° C. For a second conventional plasma device utilizing a second fan type and a chamber dome lacking fins, the temperature of the chamber appeared to stabilize after about 150 seconds to a $T_f$ of about 160° C. By contrast, an embodiment of a plasma device featuring high head, high CFM fan of the second type in conjunction with a finned dome in accordance with the present invention stabilized at a lower $T_f$ of 115° C. almost immediately. The embodiment from which the measurements of FIG. 6 were taken featured an only partially-finned dome.

Figure 7:
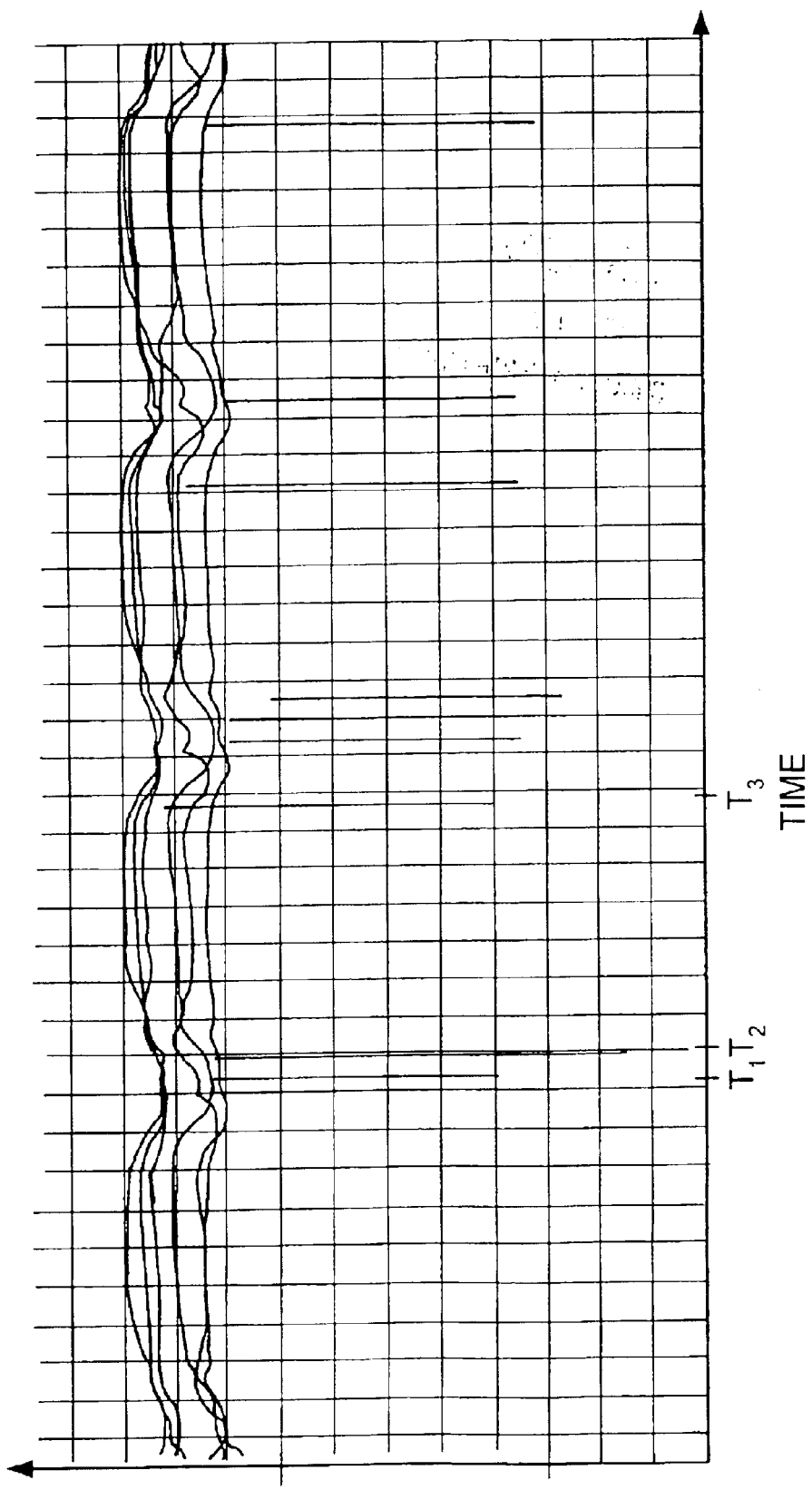
FIG. 7 plots dome temperature over time for one deposition recipe repeated sequentially four times.

FIG. 7 plots dome temperature versus time for one embodiment of an HDP-CVD apparatus in accordance with the present invention featuring a partially finned dome. The device was operated four consecutive times according to the following recipe. The top coil power was 1300 W. The side coil power was 3100 W. The wafer bias power was 3500 W. $SiH_4$ was flowed at a rate of 121 sccm. $O_2$ was flowed at a rate of 244 sccm. Air was flowed at a rate of 126 seem. The dome temperature set point was 125° C.

FIG. 7 illustrates that after a starting time $T_1$ and the application of bias to the wafer at time $T_2$, the temperature set point of the dome was controlled at 125° C. through time $T_3$. This temperature control was achieved solely through control over the speed of the fan.

Moreover, the thermal time constant of the heating/cooling system is significantly more rapid than that of a conventional HDP-CVD system. Steady state temperature of the dome in accordance with an embodiment of the present invention was achieved within about 24 seconds, or 33% of the deposition cycle between times $T_1$ and $T_3$. By contrast, a steady state temperature may be difficult to achieve at all in a conventional HDP-CVD system. In addition, the 7–10° C. range of the fluctuation of dome temperature of embodiments in accordance with the present invention shown in FIG. 7 is narrower than the 25° C. range of temperature fluctuations of conventional HDP-CVD plasma systems.

5. Temperature Sensors

Yet another feature of the embodiment of a plasma apparatus shown above in FIG. 1A is the use of specially-designed temperature sensors 134 positioned at different locations of the dome. As previously described, at least two temperature sensors contact the dome in different locations. One sensor is located near the top of the dome and another sensor is located near the periphery of the dome. One or both of these sensors can be used for control of temperature stability.

Figure 8A:
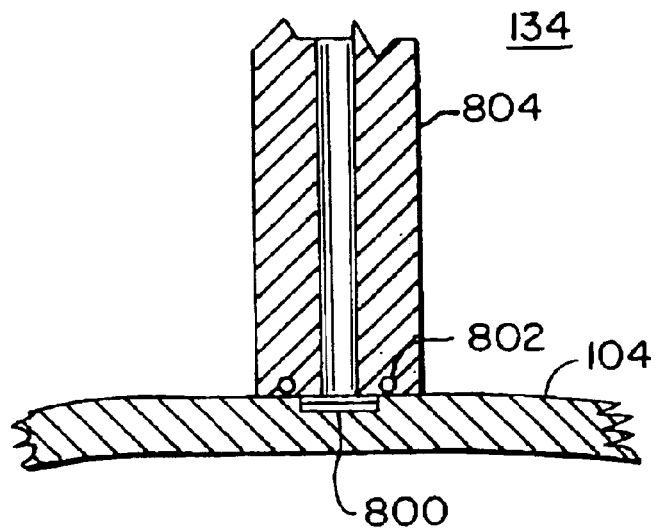
FIGS. 8A–8B show cross-sectional views of embodiments of dome temperature sensors in accordance with the present invention.
Figure 8B:
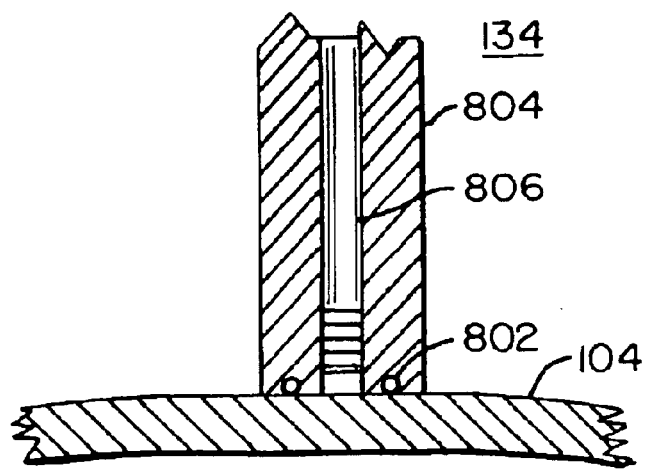

FIGS. 8A–8B show cross-sectional views of embodiments of dome temperature sensors 134 in accordance with the present invention. High temperature o-ring 802 of sensor 800 is cooled by both dome 104 and probe body 804, and is shielded from direct optical radiation. O-ring 802 prevents erroneous temperature readings by shielding stray optical radiation from the point of measurement, and by shielding airflow from the point of measurement.

In the embodiment of a temperature sensor shown in FIG. 8A, temperature-measuring medium 800, for example a temperature sensitive fluorescence time decay phosphor, is in thermal communication with dome 104 and is not in physical contact with probe 134 itself. This example of a temperature-measuring medium may be interrogated through optical fiber 808 using a temperature-dependent fluorescence decay principle.

In the alternative embodiment of a temperature sensor shown in FIG. 8B, the temperature of dome 104 is measured by a spring-loaded RF filtered thermocouple 806. The junction of this thermocouple is biased against the dome surface.

The designs of the temperature sensors just described allow for greater sensitivity to dome temperature, and hence more precise control over dome temperature in accordance with the present invention. The sensors shown in FIGS. 8A and 8B are also able to operate in a high intensity optical radiation field. This is because the sensors are made of a refractory material that is stable at very high temperatures. Moreover, the refractory material of the sensor is partially reflective, and can be made even more reflective by the addition of gold plating. A different material such as $Al_2O_3$ could alternatively be used to house the temperature sensor under circumstances where metal would couple with the RF energy from the side and top coils. The probe of the sensor can be cooled either by convection, or by direct cooling of an end projecting outside of lamp/dome cavity.

6. Faraday shield

Still another feature of embodiments in accordance with the present invention is reduction in capacitive coupling. As described above, conventional apparatuses may employ a Faraday shield structure to reduce unwanted capacitive coupling between the RF source and plasma within the chamber. Conventional plasma apparatuses may employ metal coated polymer structures that can interfere with air flow and radiative heat transfer from the dome.

However, embodiments in accordance with the present invention may allow a Faraday shield to be inserted between the coil and the dome. Specifically, the position and orientation of fin structures on the dome may define inter-fin regions bearing a grounded, electrically conductive material. Where the fins are oriented perpendicular to the direction of the coil (for example the radially-oriented fins shown in FIGS. 1A–B and 4A–4B), the resulting pattern of grounded, conductive structures defined by inter-fin regions, separated by elongated gaps corresponding to the position of the fins, may serve as a Faraday shield.

Because the Faraday shield is defined between fin structures supporting the coils, and because the Faraday shield is bonded to the dome to prevent interference with forced connective cooling or radiative heating, the dome and Faraday shield structures of embodiments in accordance with the present invention are optimally co-functional.

Figure 9:
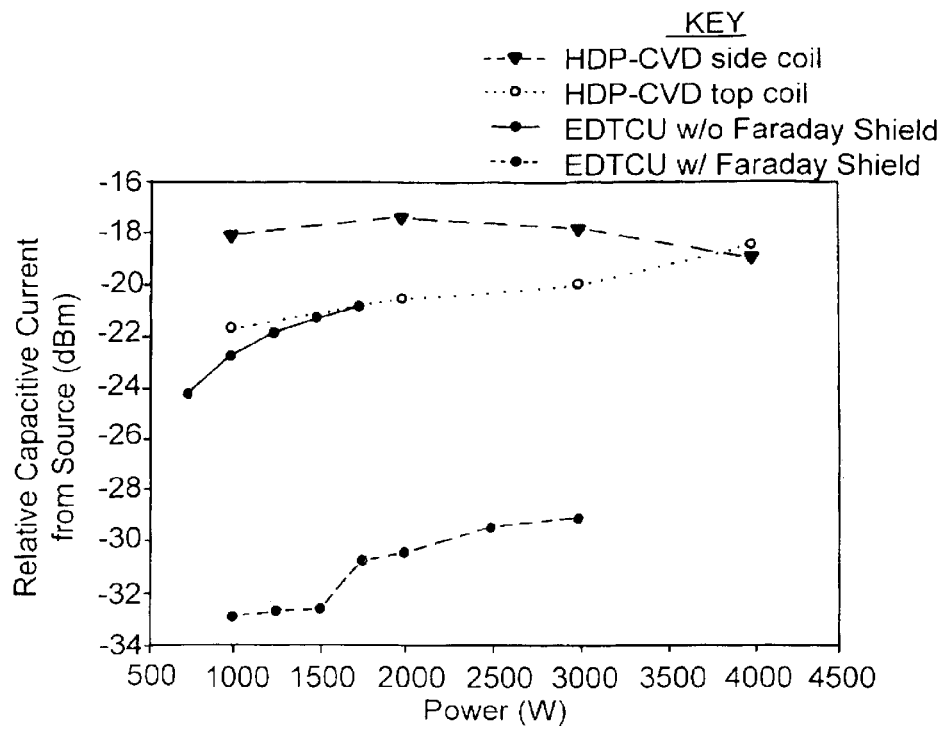
FIG. 9 plots relative coil capacitive coupling versus power for several types of HDP-CVD plasma chambers.

The value of including such a Faraday shield in a plasma generation apparatus is shown in FIG. 9. FIG. 9 plots relative coil capacitive coupling versus power for several types of plasma chambers, including 1) a conventional HDP-CVD plasma device featuring only a side coil, 2) a conventional HDP-CVD plasma device featuring only a top coil, 3) a conventional plasma etch device (EDTCU) device including a single larger coil and lacking a Faraday shield, and 4) an EDTCU device including a Faraday shield.

FIG. 9 shows that the side coil of the conventional HDP-CVD device exhibits the greatest amount of capacitive coupling. The capacitive coupling of the top coil of the conventional HDP-CVD device is approximately equivalent to that of a conventional EDTCU device lacking a Faraday shield. However, by interposing a Faraday shield between the EDTCU coil and the chamber, capacitive coupling was reduced at least eight-fold.

Embodiments in accordance with the present invention may also reduce capacitance coupling through varying the spacing of the coils from the dome using the ceramic fins, with or without low dielectric constant inserts present in the fin notches beneath the coil.

Reduction in capacitive coupling offered by embodiments in accordance with the present invention will offer a number of benefits. A first benefit of reduced capacitive coupling is diminished damage to the dome stemming from local discharge and enhanced by sputtering. For example, because of the large area and intended intimate contact of a side coil of a conventional HDP-CVD device with the high dielectric constant dome, capacitive coupling between the side coil and the dome may cause damage to the dome, particularly in dome regions adjacent to the high voltage input connection.

A second benefit of reduced capacitive coupling is decline in contamination of aluminum during discharge strikes, thereby possibly eliminating the need for a separate seasoning step. A third benefit in reduction of capacitive coupling is diminishment of dome discoloration in fluosilicate glass (FSG) or dome discoloration and resulting microcontamination and process drift due to any F-based plasma source.

Another advantage of the use of a Faraday shield in accordance with embodiments of the present invention is that the Faraday shield may also serve as a heat source in conjunction with, or in place of, optical heating sources such as the lamp arrays utilized for temperature control. Specifically, the Faraday shield structure in communication with its own power source can provide resistive heating sufficient to control the dome temperature. Resistive heating of the thin Faraday shield efficiently transfers heat to the external dome surface. Moreover, resistive heating of multiple zones in accordance with embodiments of the present invention may be accomplished through spatial distribution or appropriate segmentation of the pattern of conductive material defining the Faraday shield. For example, the Faraday shield structure could comprise a peripheral (dome wall) heater portion that is separate from a central (dome top) heater portion.

7. Coupling Efficiency

Figure 10:
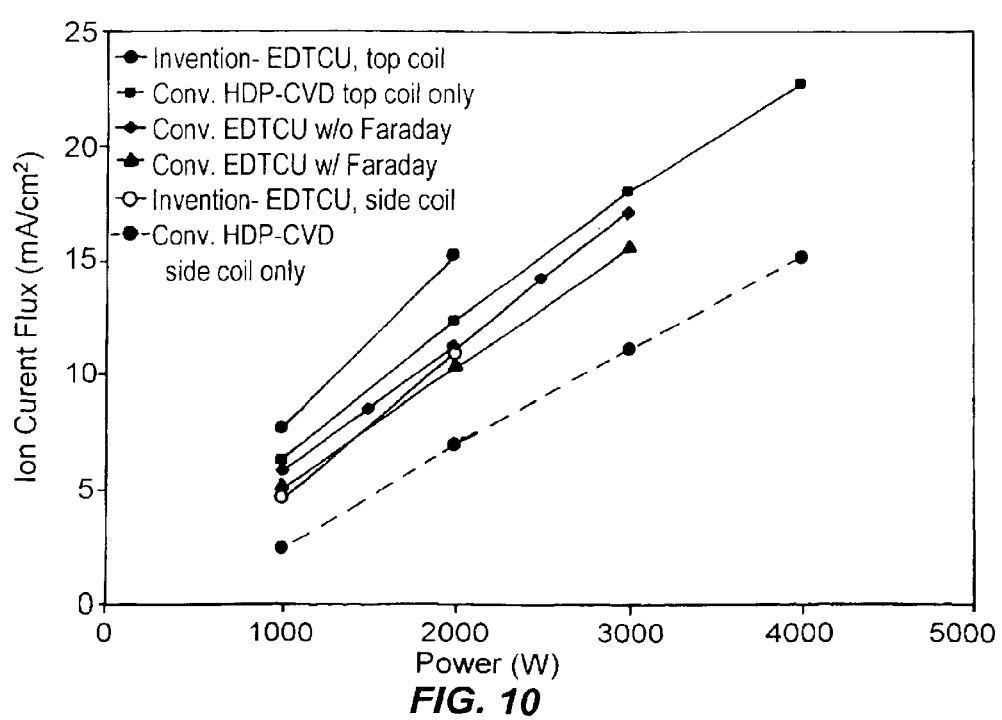
FIG. 10 plots ion current flux at the wafer versus power for several types of HDP-CVD plasma chambers.

A further feature of the embodiment of the present invention shown in FIG. 1 is its ability to maintain high RF coupling efficiency. FIG. 10 plots ion current flux at the wafer versus power for several types of plasma apparatuses: 1) the top coil only of an embodiment of an EDTCU plasma etching apparatus in accordance with the present invention; 2) the top coil only of a conventional HDP-CVD apparatus; 3) a conventional EDTCU apparatus lacking a Faraday shield; 4) the side coil only of an embodiment of an EDTCU plasma etching apparatus in accordance with the present invention; 5) a conventional EDTCU apparatus including a Faraday shield; and 6) the side coil only of a conventional HDP-CVD apparatus. The following patent, commonly assigned with the instant application, discloses features of an EDTCU plasma etching apparatus and is incorporated by reference; U.S. Pat. No. 6,308,654, "Inductively Coupled Parallel Plate Plasma Reactor With A Conical Dome".

FIG. 10 shows that for both the top and side coil examples, embodiments in accordance with the present invention exhibited greater coupling efficiencies than did the conventional apparatuses. FIG. 10 further shows that inclusion of a Faraday shield reduced coupling efficiency by only about 10%, further emphasizing the feasibility of including such a shield as described above in order to reduce capacitive coupling without substantially degrading inductive coupling efficiency.

Figure 11A:
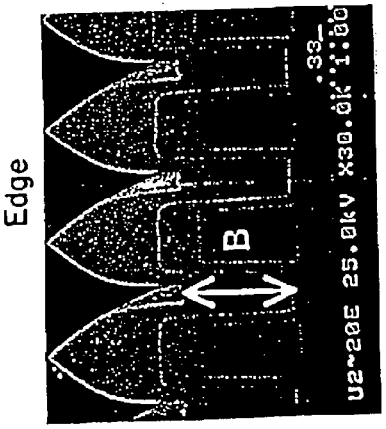
FIGS. 11A–11B are SEM photographs illustrating improvement in center-to-edge gap fill uniformity achieved by embodiments in accordance with the present invention.
Figure 11B:
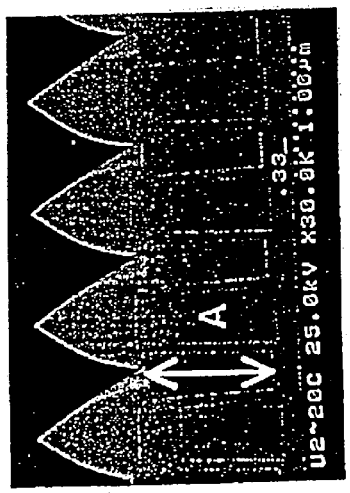

FIGS. 11A–11B show the on-wafer process results achieved with embodiments in accordance with the present invention. FIGS. 11A–11B are SEM photographs illustrating improvement in center-to-edge gap fill uniformity achieved by embodiments in accordance with the present invention. Embodiments in accordance with the present invention improve center-to-edge gap fill uniformity A and B from about 72% in the conventional HDP-CVD system to about 93% as shown in FIG. 11.

Figure 12A:
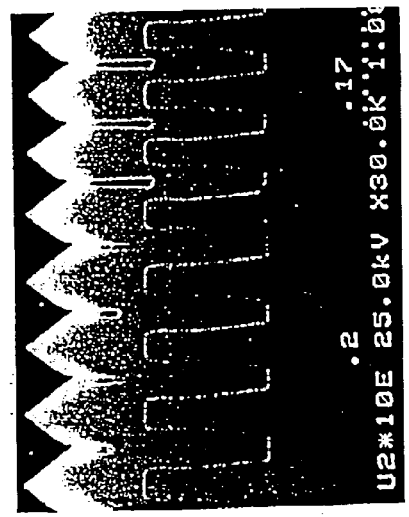
FIGS. 12A–12B are SEM photographs illustrating the extension of gap fill to smaller features as achieved by embodiments in accordance with the present invention.
Figure 12B:
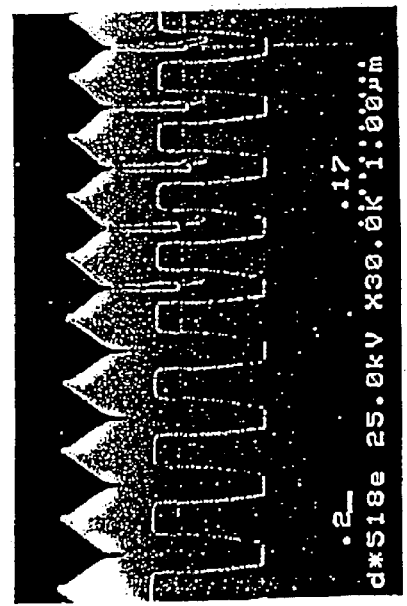

FIGS. 12A–12B are SEM photographs illustrating the extension of gap fill to smaller features. The features of FIG. 12B, subjected to deposition utilizing an embodiment of the present invention, exhibit a substantially greater percentage of fill than the conventionally-filled features of FIG. 12A.

Embodiments of plasma based fabrication apparatuses in accordance with the present invention offer a number of potential benefits over conventional devices. One benefit is enhancement in precision of control over dome temperature. For example, embodiments of the present invention provide stable (for example variation w/in a 15° C. range) dome temperatures through selective heating and cooling, at the high temperatures (between about 100° C. to >250° C.) associated with operation of the chamber under relatively high power conditions. For applications involving 200 mm diameter wafers, very high power describes a combined source and bias power of at least 10 KW; for applications involving 300 mm diameter wafers, very high power describes a combined source and wafer bias power of at least 23 KW. However, embodiments in accordance with the present invention are not limited to operation within any particular temperature range or under any particular power conditions, both of which will vary according to the particular application. And, as described above, embodiments in accordance with the present invention also provide temporal dome temperature control with dual inductive coils that may be operated at different RF powers, depending upon the needs of a particular application.

Embodiments in accordance with the present invention also provide flexibility in use in that the dome shape & coil placement may be tailored to optimize on-wafer process results without compromising dome strength or temperature management capability. In addition, the apparatus components (i.e. dome, coils, cooling ducting, heating lamp zones) are fully separable without tools for ease of serviceability and manufacturability.

Only certain embodiments of the present invention are shown and described in the instant disclosure. One should understand that the present invention is capable of use in various other combinations and environments and is capable of changes and modification within the scope of the inventive concept expressed herein.

Figure 13:
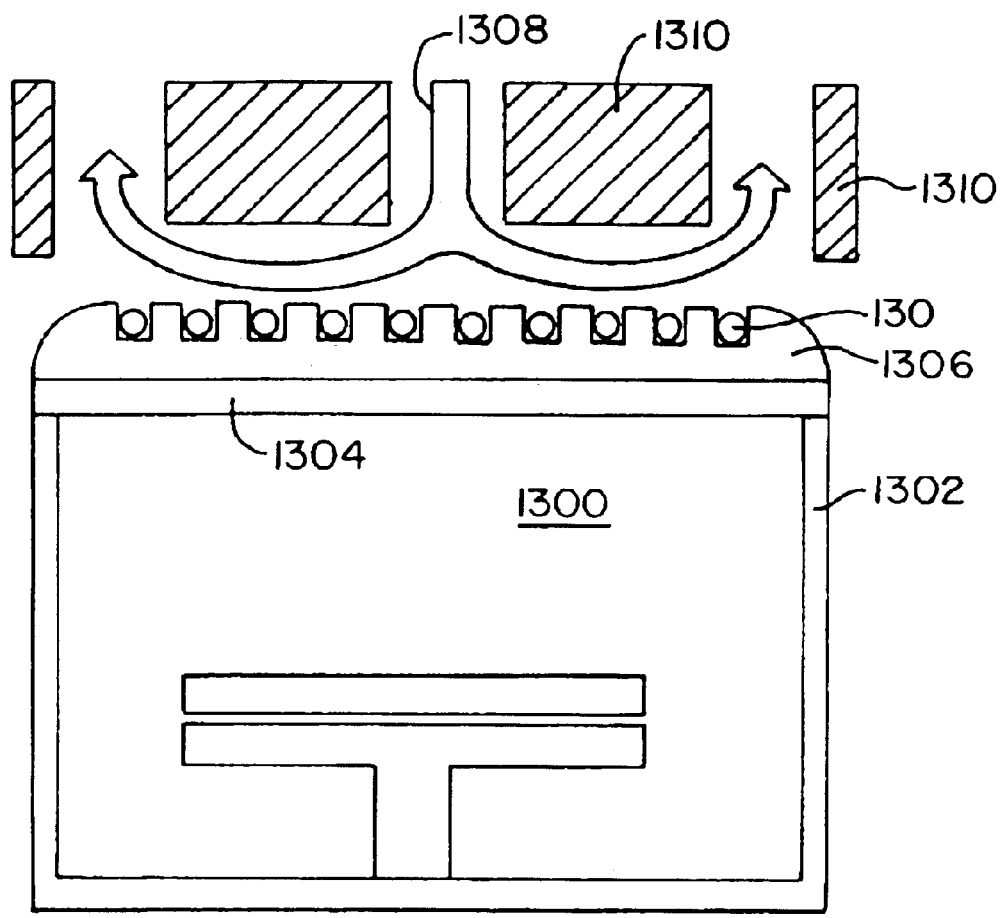
FIG. 13 shows a simplified cross-sectional view of an alternative embodiment of a temperature controlled dome-coil structure in accordance with the present invention.

For example, while the embodiment shown in FIG. 1A includes a plasma chamber defined within an overlying dome having a rounded shape, this is not required by the present invention. FIG. 13 shows a simplified cross-sectional view of an alternative embodiment of the present invention, wherein plasma processing chamber 1300 is enclosed within walls 1302 and top or ceiling 1304, and wherein the ceramic member comprising the chamber top 1304 assumes a planar or flat shape. RF coil 1305 is supported over the top of the chamber ceiling by fins 1306, which project into overlying circulating air pathway 1308 defined by chamber cover 1310.

While the embodiment shown in FIGS. 1A and 13 depict the RF source positioned over the top of the chamber, this is also not required by the present invention. Alternative embodiments in accordance with the present invention could feature a RF source positioned adjacent to the sides of the chamber.

Given the above detailed description of the present invention and the variety of embodiments described therein, these equivalents and alternatives along with the understood obvious changes and modifications are intended to be included within the scope of the present invention.

At is claimed is:

1. A substrate processing chamber comprising:
   a housing having a processing region and a substrate support to support a substrate for processing in the processing region,
   the housing including a chamber top which has an external surface,
   wherein a plurality of heat conducting fins project from the external surface of the chamber top into contact with a cooling fluid.

2. The substrate processing chamber of claim 1 wherein the chamber top comprises a chamber dome or a flat chamber top.

3. The substrate processing chamber of claim 1 wherein the heat conducting fins include a plurality of notches configured to receive a top RF coil.

4. The substrate processing chamber of claim 3 wherein the top RF coil is oriented generally perpendicular to the heat conducting fins.

5. The substrate processing chamber of claim 4 wherein the chamber top comprises a plurality of inter-fin regions disposed between the plurality of fins, and wherein an electrically conductive material is provided in the inter-fin regions.

6. The substrate processing chamber of claim 5 wherein the electrically conductive material is in selective coupling with ground.

7. The substrate processing chamber of claim 5 wherein the electrically conductive material is in selective coupling with at least one power source to resistively heat at least a portion of the chamber top.

8. The substrate processing chamber of claim 1 wherein the heat conducting fins extend radially between a center of the chamber top and a periphery of the chamber top.

9. The substrate processing chamber of claim 5 further comprising a second coil positioned proximate to a periphery of the chamber top; and
   the electrically conducting material comprises a first portion proximate to a center of the chamber top, and a second portion proximate to a periphery of the chamber top.

10. The substrate processing chamber of claim 9 wherein the first and second portions of the electrically conducting material are in electrical communication with a same power source.

11. The substrate processing chamber of claim 9 wherein the first and second portions of the electrically conducting material are in electrical communication with different power sources.

12. The substrate processing chamber of claim 5 wherein the electrically conducting material is plated onto the chamber top and exhibits a coefficient of thermal expansion approximately matching a coefficient of thermal expansion of the chamber top.

13. The substrate processing chamber of claim 5 wherein the electrically conducting material exhibits a coefficient of thermal expansion different from a coefficient of thermal expansion of the chamber top, the chamber further comprising an intermediate material adhering to both the electrically conducting material and the chamber top, the intermediate material exhibiting a mechanical compliance characteristic accommodating differences between the coefficient of thermal expansion of the chamber top and the coefficient of thermal expansion of the electrically conducting material.

14. The substrate processing chamber of claim 1 wherein the plurality of fins are integral to the chamber top.

15. The substrate processing chamber of claim 1 further comprising a cover spaced above the chamber top to define a fluid pathway between an inner surface of the cover and the external surface of the chamber top, the fluid pathway being configured to permit a fluid flow therethrough.

16. The substrate processing chamber of claim 15 wherein the fluid pathway extends radially from an inlet located near a center of the chamber top to an outlet located around a periphery of the chamber top.

17. The substrate processing chamber of claim 15 wherein the inner surface of the cover is shaped to enhance heat exchange between the fluid flow and the external surface of the chamber top.

18. The substrate processing chamber of claim 15 further comprising a flow diverter disposed in the fluid pathway to divert the fluid flow against the external surface of the chamber top.

19. The substrate processing chamber of claim 15 further comprising a fan configured to circulate a fluid flow through the fluid pathway.

20. The substrate processing chamber of claim 19 further comprising at least one temperature sensor coupled with the housing to measure a temperature of the chamber; and wherein a speed of the fan is regulated based on the measured temperature of the chamber.

21. The substrate processing chamber of claim 15 further comprising at least one heat source coupled with the housing to heat the chamber, and wherein an output of the at least one heat source is regulated based on the measured temperature of the chamber.

22. A substrate processing apparatus comprising:
   a processing chamber including a side and a top:
   a top RE source configured to apply top RE energy to the processing chamber through the top:
   a side RE source configured to apply side RE energy to the processing chamber through the side: and
   a plurality of heating members configured to apply thermal energy to different regions of the processing chamber, the plurality of heating members having thermal outputs which are regulated to provide a generally uniform temperature in the processing chamber, wherein the plurality of heating members comprise an inner radiant lamp ring disposed near a center of the top and an outer radiant lamp ring disposed near a periphery of the top.

23. The substrate processing apparatus of claim 22 wherein the top RF source comprises a top RE coil disposed above the top of the processing chamber, and wherein the side RF source comprises a side RE coil disposed around the side of the processing chamber.

24. The substrate processing apparatus of claim 22 wherein an electrically conductive material is provided in a plurality of regions of the top of the processing chamber, and wherein the plurality of heating members comprise one or more power sources in selective coupling with the electrically conductive material to selectively heat the regions of the top of the processing chamber.

25. The substrate processing apparatus of claim 22 wherein the radiant lamp rings are spaced from the top of the processing chamber by a fluid pathway extending radially from an inlet located near the center of the top to an outlet located around the periphery of the top.

26. The substrate processing apparatus of claim 22 wherein the plurality of heating members are independently controlled to apply thermal energy to the chamber.

27. The substrate processing apparatus of claim 22 further comprising a plurality of temperature sensors coupled with the processing chamber to measure temperatures at a plurality of locations of the processing chamber, and wherein the thermal outputs of the plurality of heating members are regulated based on the measured temperatures.

28. A substrate processing apparatus comprising:
a processing chamber including a side and a top;
a cover spaced above the top to define a fluid pathway between an inner surface of the cover and an external surface of the top, the fluid pathway extending radially from an inlet located near a center of the top to an outlet located around a periphery of the top to permit a fluid flow therethrough; and
at least one flow diverter disposed in the fluid pathway to divert the fluid flow against the external surface of the top.

29. The substrate processing apparatus of claim 28 wherein the at least one flow diverter comprises an airfoil member disposed between the inlet and the outlet.

30. The substrate processing apparatus of claim 29 wherein the airfoil member is spaced from the external surface of the top by a minimum distance which is smaller than at least one of a distance between the cover and the external surface of the top at the inlet and a distance between the cover and the external surface of the top at the outlet.

31. The substrate processing apparatus of claim 28 wherein the at least one flow diverter comprises an external lip projecting from the inner surface of the cover toward the external surface of the top at or near the outlet of the fluid pathway.

32. The substrate processing apparatus of claim 28 further comprising a fan configured to circulate a fluid through the fluid pathway.

33. The substrate processing chamber of claim 32 further comprising at least one temperature sensor coupled with the processing chamber to measure a temperature of the processing chamber, and wherein a speed of the fan is regulated based on the measured temperature of the processing chamber.

34. A dome structure for a semiconductor processing tool, the dome structure comprising:
a ceramic member configured to form a portion of a housing defining a chamber of the semiconductor processing tool; and
a fin configured to project from an external surface of the ceramic member into contact with a cooling fluid.

35. The dome structure of claim 34 further comprising an RF source proximate to the ceramic member and configured to apply RF energy to maintain a plasma within the chamber.

36. The dome structure of claim 35 wherein:
the RE source comprises a coil proximate to the ceramic member and configured to generate an inductively-coupled plasma within the chamber; and
the dome comprises a plurality of the fins including a notch for supporting the coil proximate to the ceramic member.

37. The dome structure of claim 36 further comprising an electrically conducting material in contact with inter-fin regions of the ceramic member, the electrically conducting material separated by elongated gaps oriented perpendicular to a direction of the coil.

38. The dome structure of claim 37 wherein the ceramic member is in the shape of a circle or oval, and the fins and elongated gaps are radially-oriented.

39. The dome structure of claim 37 wherein the electrically conducting material is configured to be in selective communication with ground to reduce capacitive coupling between the coil and the plasma.

40. The dome structure of claim 37 wherein the electrically conducting material is configured to be in selective communication with a power source in order to resistively heat the dome structure.

41. The dome structure of claim 36 wherein:
the coil is positioned proximate to a central portion of the ceramic member;
the RE source further comprises a second coil positioned proximate to a peripheral portion of the ceramic member; and
the electrically conducting material comprises a first portion proximate to the central portion of the ceramic member, and a second portion proximate to the peripheral portion of the ceramic member.

42. The dome structure of claim 41 wherein the first and second portions of the electrically conducting material are configured to be in electrical communication with a same power source.

43. The dome structure of claim 41 wherein the first and second portions of the electrically conducting material are configured to be in electrical communication with different power sources.

44. The dome structure of claim 37 wherein the electrically conducting material is plated onto the ceramic member and exhibits a coefficient of thermal expansion approximately matching a coefficient of thermal expansion of the ceramic member.

45. The dome structure of claim 37 wherein the electrically conducting material exhibits a coefficient of thermal expansion different from a coefficient of thermal expansion of the ceramic member, the dome structure further comprising an intermediate material adhering to both the electrically conducting material and the ceramic member, the intermediate material exhibiting a mechanical compliance characteristic accommodating differences between the coefficient of thermal expansion of the ceramic member and the coefficient of thermal expansion of the electrically conducting material.

46. The dome structure of claim 34 wherein the fin is integral with the ceramic member.

47. The dome structure of claim 34 further comprising:
a temperature sensor in communication with the dome structure; and
a processor in electrical communication with the temperature sensor and with a fan, the fan in thermal communication with the dome structure, the processor configured to regulate a speed of the fan according to an output of the temperature sensor to maintain a substantially constant temperature of the dome structure.

48. A method for maintaining a substantially constant temperature of a plasma processing chamber subjected to an applied RF power to generate a plasma therein, the method comprising:

providing a fin on an exterior surface of the chamber; and causing a flow of a cooling fluid to contact the fin and convey thermal energy away from the chamber.

49. The method of claim 48 further comprising reducing capacitive coupling between an RF source external to the chamber and plasma generated within the chamber by providing an electrically conducting material in inter-fin regions of the exterior chamber surface, and selectively grounding the electrically conducting material.

50. The method of claim 49 further comprising heating the chamber by selectively applying a voltage to the electrically conducting material.

51. The method of claim 48 further comprising cooling the chamber by providing directing the airflow against the exterior surface of the chamber with an airflow diverting member selected from an airfoil and a projecting lip of a cover overlying the chamber.

52. The method of claim 48 further comprising cooling the chamber by controlling a speed of a fan in communication with the airflow to maintain a dome temperature within a range of 15° C. or less.

53. The method of claim 52 wherein cooling the chamber comprises:

providing a temperature sensor in thermal communication with the chamber;

providing a processor in electrical communication with the temperature sensor and with the fan; and causing the processor to regulate a speed of the fan according to an output of the temperature sensor to maintain the dome temperature within the range of 15° C. or less.

54. The method of claim 53 further comprising:

providing a heat source in thermal communication with the chamber and in electrical communication with the processor; and causing the processor to regulate a speed of the fan according to operation of the heat source.

55. The method of claim 48 wherein a 200 mm diameter semiconductor wafer housed within the chamber is subjected to the applied RF power of greater than 10 KW.

56. The method of claim 48 wherein a 300 mm diameter semiconductor wafer housed within the chamber is subjected to the applied RF power of greater than 23 KW.

* * * * *